United States Patent
Nohara et al.

(10) Patent No.: US 6,458,517 B2
(45) Date of Patent: Oct. 1, 2002

(54) PHOTORESIST STRIPPING COMPOSITION AND PROCESS FOR STRIPPING PHOTORESIST

(75) Inventors: Masahiro Nohara, Osaka (JP); Yukihiko Takeuchi, Osaka (JP); Hisaki Abe, Niigata-ken (JP); Taketo Maruyama, Niigata-ken (JP); Tetsuo Aoyama, Niigata-ken (JP)

(73) Assignees: Sharp Kabushiki Kaisha, Osaka (JP); Mitsubishi Gas Chemical Company Inc., Tokyo (JP)

( * ) Notice: Subject to any disclaimer, the term of this patent is extended or adjusted under 35 U.S.C. 154(b) by 0 days.

(21) Appl. No.: 09/536,643

(22) Filed: Mar. 28, 2000

(30) Foreign Application Priority Data

Mar. 31, 1999 (JP) .............................. 11-092377

(51) Int. Cl.[7] ................................. G03F 7/42
(52) U.S. Cl. ..................... 430/329; 430/331; 510/176
(58) Field of Search ................ 430/331, 329; 510/176

(56) References Cited

U.S. PATENT DOCUMENTS

| | | | | |
|---|---|---|---|---|
| 4,904,571 A | * | 2/1990 | Miyashita et al. | 430/331 |
| 4,917,122 A | * | 4/1990 | Lapham et al. | 134/3 |
| 4,931,103 A | * | 6/1990 | Atwater | 510/176 |
| 5,192,461 A | | 3/1993 | Tomaszewski et al. | 252/156 |
| 5,567,574 A | * | 10/1996 | Hasemi et al. | 430/331 |
| 5,798,323 A | * | 8/1998 | Honda et al. | 510/176 |
| 5,962,192 A | * | 10/1999 | Holman, III et al. | 430/302 |
| 6,211,127 B1 | * | 4/2001 | Kim et al. | 510/176 |

FOREIGN PATENT DOCUMENTS

| | | |
|---|---|---|
| EP | 0723205 | 7/1996 |
| JP | 62-49355 | 3/1987 |
| JP | 62-95531 | 5/1987 |
| JP | 64-81949 | 3/1989 |
| JP | 64-81950 | 3/1989 |
| JP | 4-124668 | * 4/1992 |
| JP | 5-273768 | 10/1993 |

OTHER PUBLICATIONS

Patent Abstracts of Japan, vol. 016, No. 386 (P–1404)—Publication No.: 04124668—Publication Date: Aug. 18, 1992.

* cited by examiner

Primary Examiner—Ronald L. Schilling
(74) Attorney, Agent, or Firm—Antonelli, Terry, Stout & Kraus, LLP

(57) ABSTRACT

A photoresist stripping composition comprises (1) a nitrogen-containing organohydroxyl compound, (2) an alkylene glycol monoalkyl ether represented by the general formula: $HO-(C_pH_{2p}O)_q-R$, wherein R is $C_1-C_4$ alkyl, p is 2 or 3, and q is 1, 2 or 3, (3) sugar or sugar alcohol, (4) a phosphorus-containing compound and (5) water. The photoresist stripping composition easily removes photoresist films on the inorganic substrate, and patterned photoresist films and photoresist residues remaining after etching and photoresist residues in a short period of time without corroding semiconductive materials, circuit-forming materials, insulating materials, etc.

17 Claims, 2 Drawing Sheets

PHOTORESIST STRIPPING COMPOSITION AND PROCESS FOR STRIPPING PHOTORESIST

BACKGROUND OF THE INVENTION

The present invention relates to a photoresist stripping composition and a process for stripping photoresists, and more particularly, to a stripping composition for removing photoresist films in the production of semiconductor devices and liquid crystal display elements, and a process for stripping photoresist films using the stripping composition.

Semiconductor devices have been produced by the steps of coating an inorganic substrate with a photoresist; patterning the photoresist film by exposure to light and subsequent development; etching exposed region of the inorganic substrate using the patterned photoresist film as a mask to form minute circuits; and removing the patterned photoresist film from the inorganic substrate. Alternatively, after forming minute circuits in the same manner as above, the patterned photoresist film is ashed, and then the remaining resist residues are removed from the inorganic substrate.

Recently, LCD (liquid crystal displays), especially TFT-LCD (thin-film transistor liquid crystal displays) are coming to have a larger substrate size. This leads to various troubles due to nonuniformity in film formation of circuit-forming materials, insulating materials and resist materials as well as due to uneven exposure, development and etching, resulting in increased rate of defective products.

In particular, the nonuniformity in formed films is likely to cause generation of dust due to exfoliation of the formed films during wet-etching, or generation of dust due to resist residues during dry-etching. These dusts are very difficult to remove even by a photoresist stripping solution. In some cases, the dusts remaining not removed causes unsatisfactory bonding of a film formed in subsequent steps. Thus, the nonuniformity in films finally results in increased rate of defective products.

Japanese Patent Applications Laid-Open Nos. 62-49355, 62-95531, 64-981949, 64-81950 and 5-273768 propose to remove photoresist films remaining after dry-etching by photoresist stripping solutions containing amino alcohol. However, these photoresist stripping solutions have no effect on removal of the dusts generated during etching process.

Accordingly, in order to solve the problems, it has been demanded to develop a high-performance photoresist stripping solution which is capable of easily removing resist films, resist residues and dusts generated during etching process, and is highly resistant to corrosion of materials for use in the production of liquid crystal display elements or semiconductor devices.

SUMMARY OF THE INVENTION

It is an object of the present invention to provide a photoresist stripping composition which is capable of easily removing photoresist films formed on an inorganic substrate, photoresist residues and dusts generated during etching process in the production of liquid crystal display elements or semiconductor devices, and is highly resistant to corrosion of various semiconductive materials, conductive materials and insulating materials.

As a result of extensive studies to solve the above problems in the prior art, the present inventors have found that a photoresist stripping composition comprising (1) a nitrogen-containing organohydroxyl compound, (2) a specific alkylene glycol monoalkyl ether, (3) a sugar or sugar alcohol, (4) a phosphorus-containing compound and (5) water, completely removes photoresist films, photoresist residues and dusts generated during etching process at low temperatures for a short period of time without causing corrosion of the materials. The present invention has been accomplished based on this finding.

Thus, the present invention provides a photoresist stripping composition comprising (1) a nitrogen-containing organohydroxyl compound, (2) an alkylene glycol monoalkyl ether represented by the general formula: HO—$(C_pH_{2p}O)_q$—R wherein R is $C_1$–$C_4$ alkyl, p is 2 or 3, and q is 1, 2 or 3, (3) a sugar or sugar alcohol, (4) a phosphorus-containing compound and (5) water.

The present invention further provides a process for stripping photoresist using the photoresist stripping composition.

DETAILED DESCRIPTION OF THE INVENTION

Figure 1:
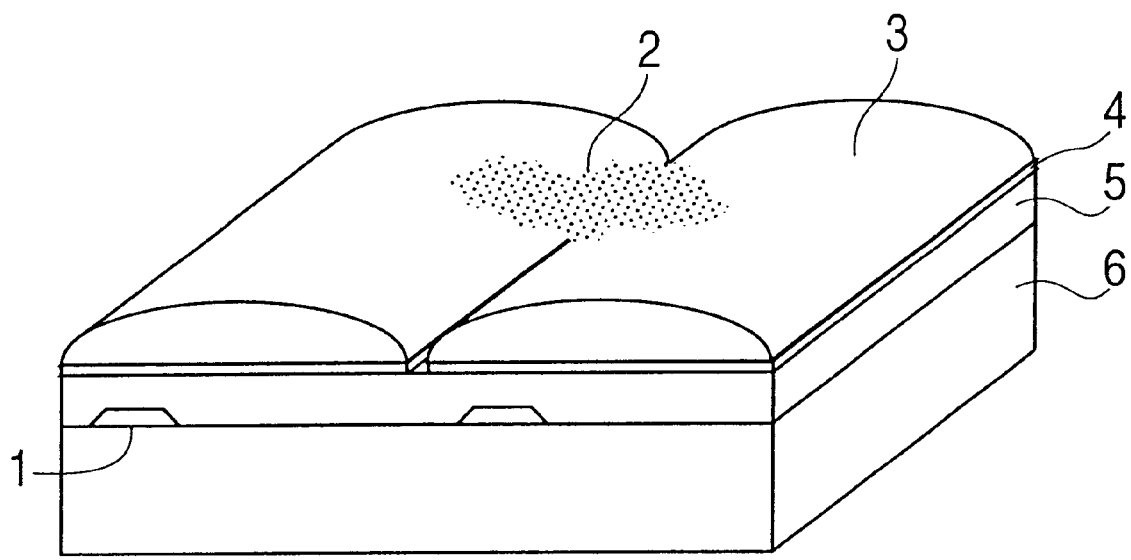
FIG. 1 is a schematic view showing an LCD element after wet-etching ITO film with an aqueous ferric chloride/hydrochloric acid solution using a resist film as a mask.
Figure 2:
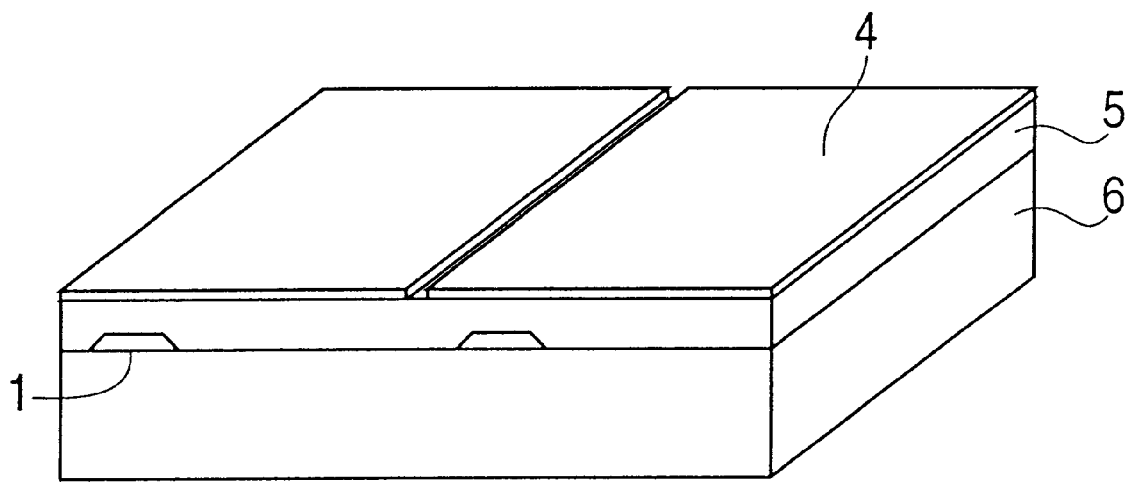
FIG. 2 is a schematic view showing the LCD element of FIG. 1 after resist film and dust removal treatment with a stripping composition of the present invention.

The nitrogen-containing organohydroxyl compounds (1) are not particularly limited and may include monoethanolamine, diethanolamine, triethanolamine, N-methylethanolamine, N,N-dimethylethanolamine, N-ethylethanolamine, N,N-diethylethanolamine, propanolamine, N,N-dimethylpropanolamine, N-ethylpropanolamine, N,N-diethylpropanolamine, 2-(2-aminoethoxy)ethanol, N-hydroxyethylpiperazine, 4-(2-hydroxyethyl)morpholine, 2-(2-hydroxyethyl)pyridine, 2-piperidine methanol and N-methyl-4-piperidinol. Of these nitrogen-containing organohydroxyl compounds, preferred are monoethanolamine, N-methylethanolamine, 2-(2-aminoethoxy)ethanol and 4(2-hydroxyethyl)morpholine.

The content of the nitrogen-containing organohydroxyl compound (1) in the stripping composition may be selected from a wide range, and preferably 30 to 80% by weight, more preferably 40 to 60% by weight based on the total weight of the composition. Too small a content is likely to lower the photoresist-stripping speed. Too large a content sometimes fails to prevent the corrosion of circuit-forming materials, etc.

The alkylene glycol monoalkyl ethers (2) are represented by the general formula:

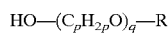

wherein R is $C_1$–$C_4$ alkyl, p is 2 or 3, and q is 1, 2 or 3.

Specific examples of the alkylene glycol monoalkyl ethers (2) include ethylene glycol monoethyl ether, ethylene glycol monobutyl ether, propylene glycol monomethyl ether, propylene glycol monoethyl ether, propylene glycol monobutyl ether, diethylene glycol monomethyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether and tripropylene glycol monobutyl ether.

The content of the alkylene glycol monoalkyl ether (2) varies depending on various factors, and is preferably 5 to 40% by weight, more preferably 15 to 30% by weight based on the total weight of the composition. When the content is too small, the corrosion of circuit-forming materials, etc. becomes significant in some cases. Too large a content sometimes disadvantageously reduces the photoresist-stripping speed.

The stripping composition of the present invention contains the sugar or sugar alcohol (3). The sugar may be monosaccharide or polysaccharide. Specific examples of the sugars include monosaccharides having 3 to 6 carbon atoms such as glycerin aldehyde, threose, arabinose, xylose, ribose, ribulose, xylulose, glucose, mannose, galactose, tagatose, allose, altrose, gulose, idose, talose, sorbose, psicose and fructose, and polysaccharides such as sucrose, maltose, cellobiose, lactose, sophorose, laminaribiose, manninotriose, araban, xylan, mannan and starch. Examples of the sugar alcohols include threitol, erythritol, adonitol, arabitol, xylitol, talitol, sorbitol, mannitol, iditol and dulcitol. Of these sugars and sugar alcohols, preferred are glucose, mannose, galactose, sorbitol, mannitol and xylitol in view of good solubility and degradability.

The content of the sugar or sugar alcohol (3) varies depending on various factors, and is preferably 0.1 to 15% by weight, more preferably 1 to 10% by weight based on the total weight of the stripping composition. Too small a content sometimes fails to effectively prevent the corrosion of circuit-forming materials, etc. Too large a content gives no further effect and is, therefore, economically undesirable.

Examples of the phosphorus-containing compounds (4) include phosphoric acid and its related acids, phosphate surfactants and phosphonic acid chelating agents. The term "phosphoric acid and its related acids" as used herein includes orthophosphoric acid, hypophosphoric acid, phosphorous acid, hypophosphorous acid, polyphosoporic acids such as pyrophosphoric acid, trimetaphosphoric acid and tetrametaphosphoric acid, polyphosphorous acids, and polymetaphosphorous acids. In the present invention, ammonium salts, amine salts and quaternary ammonium salts of these "phosphoric acid and its related acids" may also be used as the phosphorus-containing compound (4).

The suitable phosphate surfactants include, for example, those represented by the general formula (1):

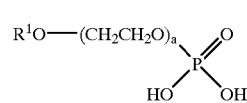

(1)

wherein $R^1$ is $C_1$–$C_{30}$ alkyl or $C_7$–$C_{30}$ alkylaryl, and "a" is an integer of 1 to 200, and those represented by the general formula (2):

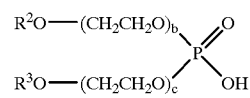

(2)

wherein $R^2$ and $R^3$ may be the same or different and are independently $C_1$–$C_{30}$ alkyl or $C_7$–$C_{30}$ alkylaryl, "b" is an integer of 1 to 200 and "c" is an integer of 1 to 200.

In the formulae (1) and (2), preferred alkyl groups are those having 2 to 12 carbon atoms., and preferred alkylaryl groups are those having 14 to 18 carbon atoms.

The phosphate surfactants may be commercially available as ADEKACOL (produced by Asahi Denka Kogyo Co., Ltd.), PLYSURF (produced by Dai-Ichi Kogyo Seiyaku Co., Ltd.), PHOSPHANOL (Toho Kagaku Kogyo Co., LTD.) and NEWCOL and ANTOX (produced by Nippon Nyukazai Co., Ltd.).

The phosphonic acid chelating agents may be chelating agents having at least one phosphonic acid group or its salt form in one molecule, and exemplified by phosphonic acids such as methyldiphosphonic acid, hydroxyethanediphosphonic acid, aminotris(methylene)phosphonic acid, ethylidenediphosphonic acid, 1-hydroxyethylidene-1,1-diphosphonic acid, 1-hydroxypropylidene-1,1-diphosphonic acid, ethylaminobis(methylene)phosphonic acid, dodecylaminobis(methylene)phosphonic acid, nitrilotris (methylene)phosphonic acid, ethylenediaminebis (methylene)phosphonic acid, ethylenediaminetetrakis (methylene)phosphonic acid, hexenediaminetetrakis (methylene)phosphonic acid, diethylenetriaminepentamethylenephosphonic acid and 1,2-propanediaminetetramethylenephosphonic acid, ammonium salts thereof, alkali metal salts thereof and organic amine salts thereof. In the present invention, also usable as the phosphorus-containing compound (4) are oxidized forms of the phosphonic acid chelating agents such as N-oxides formed by oxidation of nitrogen atom of the phosphonic acid chelating agents.

These phosphorus-containing compounds (4) may be used alone or in combination of two or more.

The content of the phosphorus-containing compound (4) may be appropriately determined depending on various factors, and is preferably 0.01 to 10% by weight, more preferably 0.1 to 5% by weight based on the total weight of the stripping composition. Too small a content is likely to inhibit resist residues from being sufficiently removed. When the content is too large, the removal of photoresist detrimentally becomes insufficient.

The stripping composition according to the present invention is an aqueous composition comprising the components (1) to (4) and balance being substantially water. The aqueous composition may be dispersion or suspension, although usually aqueous solution. Further, the composition according to the present invention may optionally contain suitable additives used in conventional photoresist stripping agents unless the addition thereof adversely affects the objects of the present invention.

The photoresist stripping composition of the invention may be produced by any methods known in the art. For example, the components (1) to (4) are added to water under stirring until a homogeneous mixture is obtained. The order of adding the components is not critical, and the components may be added successively or all at once.

The process according to the present invention is directed to the removal of photoresist using the above stripping composition, particularly to the removal of photoresist films formed on an inorganic substrate in the production of semiconductor integrated circuits or liquid crystal displays. Materials for the inorganic substrates may include conductive or semiconductive circuit-forming materials such as silicon, amorphous silicon, polysilicon, silicon oxide, silicon nitride, aluminum, aluminum alloys, titanium, titanium-tungsten alloys, titanium nitride, tungsten, tantalum, tantalum compounds, tantalum alloys, chromium, chromium oxides, chromium alloys, ITO (indium-tin-oxide); compound semiconductors such as gallium-arsenic, gallium-phosphorus and indium-phosphorus; and glass substrates for LCD.

The photoresist stripping agent of the present invention is used to remove photoresist films coated on inorganic substrate, patterned photoresist films remaining after etching process, or photoresist residues remaining after ashing of patterned photoresist films subsequent to etching process. In the stripping process, photoresist films, photoresist residues, dusts are brought into contact with the stripping composition ordinarily by immersion or other methods such as spraying. During the stripping treatment, heating and ultrasonic exposure or the like may be appropriately employed, if required. After the treatment with the stripping composition, the treated substrate may be rinsed with any of organic solvent such as alcohol or water. In a preferred process, the stripping may be conducted at 40 to 80° C. for few minutes.

By using the photoresist stripping agent composition according to the present invention, photoresist films coated on inorganic substrate, patterned photoresist films remaining after etching process, photoresist residues remaining after ashing patterned photoresist films subsequent to the etching process, and dusts generated during the etching process are easily removed at low temperatures for a short period of time. During the stripping treatment, the circuit-forming materials are free from any corrosion and capable of being finely processed, resulting in production of high-precision and high-quality circuits.

The present invention will be described in more detail by examples and comparative examples. However, it should be noted that the following examples are not intended to limit the invention thereto.

EXAMPLE 1

FIG. 1 is a schematic view showing an LCD element after wet-etching ITO film with an aqueous ferric chloride/hydrochloric acid solution using a resist film as a mask. On a glass substrate 6, was formed a TFT layer 1 on which an acrylic resin passivation film 5 was formed. On the passivation film 5, was formed transparent ITO electrodes 4 as pixel electrodes, on which patterned resist films 3 still remained. Dusts 2, which seemed to be ITO-resist mixed residues generated during wet-etching, also remained on the ITO electrodes 4 and the patterned resist films 3.

The LCD element shown in FIG. 1 was immersed at 50° C. for 5 minutes in a stripping composition comprising 50.0% by weight of monomethanol amine, 24.0% by weight of diethylene glycol monobutyl ether, 5.0% by weight of sorbitol, 1.0% by weight of a phosphate surfactant ANTOX EHD400 (produced by Nippon Nyukazai Co., Ltd.) and 20% by weight of water, rinsed with ultrapure water and then dried. Thereafter, the surface of the LCD element thus treated was observed under scanning electron microscope (SEM). The result showed that the patterned resist films 3 and the dusts 2 were completely removed.

EXAMPLES 2 TO 12

An LCD element as shown in FIG. 1 was immersed in each of stripping compositions having chemical compositions shown in Table 1 under the conditions shown in Table 1, rinsed with ultrapure water, dried and then observed under SEM to evaluate the removal of the patterned resist films 3 and dusts 2. The results are shown in Table 1.

The results of evaluation by SEM observation are expressed by the following ratings.

Degree of Removal:
++: Completely removed.
+: Almost completely removed.
−: Partially remained.
−−: Most remained.

TABLE 1

| | Stripping Compositions | | | | | | | | |
|---|---|---|---|---|---|---|---|---|---|
| | N-Containing Organohydroxyl compound (wt. %) | | HO—$(C_pH_{2p}O)_q$—R (wt. %) | | Sugar or Sugar alcohol (wt. %) | | P-containing compound (wt. %) | | Water (wt. %) |
| Examples | | | | | | | | | |
| 2 | a1 | 40.0 | b1 | 29.0 | c1 | 5.0 | d1 | 1.0 | 25.0 |
| 3 | a1 | 60.0 | b1 | 25.0 | c1 | 5.0 | d1 | 1.0 | 9.0 |
| 4 | a1 | 52.0 | b1 | 25.0 | c1 | 2.0 | d1 | 1.0 | 20.0 |
| 5 | a1 | 49.9 | b1 | 25.0 | c1 | 5.0 | d1 | 0.1 | 20.0 |
| 6 | a2 | 70.0 | b1 | 10.0 | c1 | 5.0 | d1 | 1.0 | 14.0 |
| 7 | a1 | 60.0 | b2 | 25.0 | c1 | 5.0 | d1 | 1.0 | 9.0 |
| 8 | a1 | 50.0 | b1 | 24.0 | c2 | 5.0 | d1 | 1.0 | 20.0 |
| 9 | a3 | 50.0 | b1 | 24.0 | c1 | 5.0 | d2 | 1.0 | 20.0 |
| 10 | a4 | 50.0 | b1 | 24.0 | c1 | 5.0 | d2 | 1.0 | 20.0 |
| 11 | a1 | 60.0 | b3 | 20.0 | c1 | 3.0 | d2 | 1.0 | 16.0 |
| 12 | a1 | 50.0 | b1 | 24.0 | c1 | 5.0 | d3 | 1.0 | 20.0 |

TABLE 1-continued

|  | Stripping Conditions | | Degree of Removal | |
|---|---|---|---|---|
|  | temperature (° C.) | time (minute) | resist films | dusts |
| Examples | | | | |
| 2 | 50 | 5 | ++ | ++ |
| 3 | 50 | 5 | ++ | ++ |
| 4 | 50 | 5 | ++ | ++ |
| 5 | 50 | 10 | ++ | ++ |
| 6 | 50 | 10 | ++ | ++ |
| 7 | 50 | 10 | ++ | ++ |
| 8 | 50 | 10 | ++ | ++ |
| 9 | 50 | 5 | ++ | ++ |
| 10 | 50 | 10 | ++ | ++ |
| 11 | 50 | 10 | ++ | ++ |
| 12 | 50 | 10 | ++ | ++ | a1 Monoethanol amine.
a2 N-methylmethanol amine.
a3 2-(2-aminoethoxy)ethanol.
a4 4-(2-hydroxyethyl)morpholine.
b1 Diethylene glyeol monobutyl ether.
b2 Diethylene glycol monomethyl ether.
b3 Dipropylene glycol monomethyl ether.
c1 Sorbitol.
c2 Xylitol.
d1 ANTOX EHD400 (phosphate surfactant produced by Nippon Nyukazai Co., Ltd.).
d2 Hydroxyethanediphosphonic acid.
d3 propanediaminetetramethylenephophonic acid.

EXAMPLE 13

The same LCD element as used in Example 1 was immersed at 40° C. for 10 minutes in a stripping composition comprising 50.0% by weight of ethanolamine, 24.0% by weight of diethylene glycol monobutyl ether, 5.0% by weight of sorbitol, 1.0% by weight of a phosphate surfactant ANTOX EHD400 (produced by Nippon Nyukazai Co., Ltd.), 0.3% by weight of hydroxyethanephosphonic acid and 19.7% by weight of water, rinsed with ultrapure water and then dried. The result of SEM observation of the LCD element thus treated showed that the patterned resist films 3 and the dusts 2 were completely removed from the substrate.

COMPARATIVE EXAMPLES 1 TO 7

Figure 3:
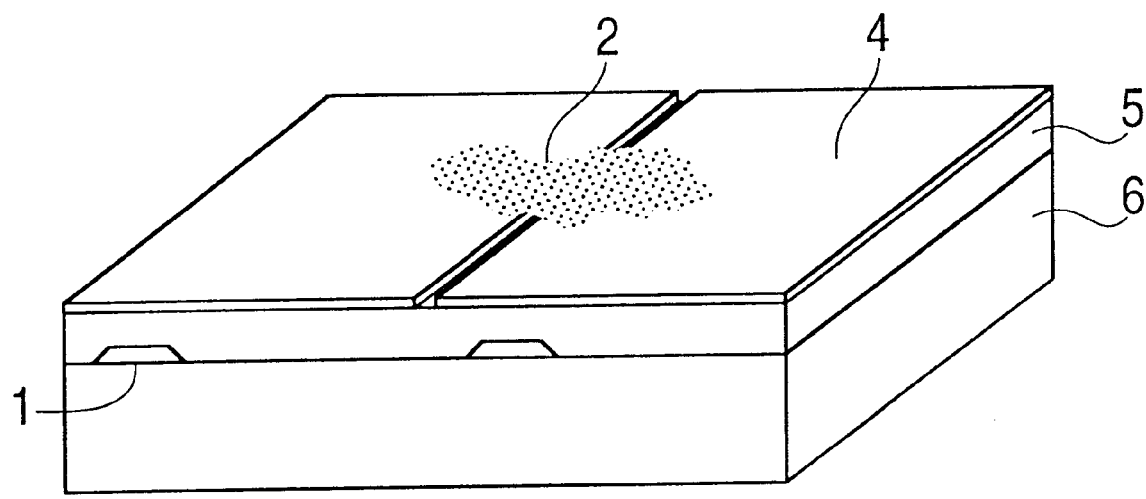
FIG. 3 is a schematic view showing the LCD element of FIG. 1 after resist film and dust removal treatment with a stripping composition of Comparative Example 2.

The same LCD element as used in Example 1 was immersed in each of stripping compositions having chemical compositions shown in Table 2 under the conditions shown in Table 2, rinsed with ultrapure water and then dried. The SEM observation was carried out in the same manner as in Example 1 to evaluate the removal of the patterned resist films 3 and the dusts 2 according to the above ratings. The results are shown in Table 2. FIG. 3 is a schematic view showing an LCD element after the stripping treatment in which the patterned resist films 3 was removed but the dusts 2 still remained (corresponding to Comparative Example 2).

TABLE 2

| | Stripping Compositions | | | | | | | | |
|---|---|---|---|---|---|---|---|---|---|
| | N-Containing Organohydroxyl compound (wt. %) | | HO—$(C_pH_{2p}O)_q$— (wt. %) | | Sugar or Sugar alcohol (wt. %) | | P-containing compound (wt. %) | | Water (wt. %) |
| Comparative Examples | | | | | | | | | |
| 1 | a1 | 50.0 | — | | — | | — | | 50.0 |
| 2 | a1 | 50.0 | b1 | 24.0 | — | | — | | 26.0 |
| 3 | a1 | 50.0 | b1 | 24.0 | c1 | 5.0 | — | | 21.0 |
| 4 | — | | b1 | 24.0 | c1 | 5.0 | — | | 71.0 |
| 5 | — | | b1 | 24.0 | c1 | 5.0 | d1 | 1.0 | 70.0 |
| 6 | a1 | 50.0 | — | | c1 | 5.0 | — | | 45.0 |
| 7 | a1 | 50.0 | — | | c1 | 5.0 | d1 | 1.0 | 44.0 | a1 Monoethanol amine.
b1 Diethylene glycol monobutyl ether.
c1 Sorbitol.
d1 ANTOX EHD400 (phosphate surfactant produeed by Nippon Nyukazai Co., Ltd.).

TABLE 2-continued

|  | Stripping Conditions | | Degree of Removal | |
|---|---|---|---|---|
|  | temperature (° C.) | time (minute) | resist films | dusts |
| Comparative Examples | | | | |
| 1 | 50 | 20 | − | −− |
| 2 | 50 | 20 | ++ | −− |
| 3 | 50 | 20 | ++ | − |
| 4 | 50 | 20 | −− | −− |
| 5 | 50 | 20 | −− | −− |
| 6 | 50 | 20 | − | −− |
| 7 | 50 | 20 | − | −− |

What is claimed is:

1. A photoresist stripping composition comprising (1) a nitrogen-containing organohydroxyl compound, (2) an alkylene glycol monoalkyl ether represented by the general formula:

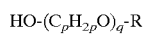

$$HO\text{-}(C_pH_{2p}O)_q\text{-}R$$

wherein R is $C_1$–$C_4$ alkyl, p is 2 or 3, and q is 1, 2 or 3, (3) a sugar or sugar alcohol, (4) a phosphonic acid chelating agent and (5) water.

2. The photoresist stripping composition according to claim 1, wherein said nitrogen-containing organohydroxyl compound is at least one compound selected from the group consisting of monoethanolamine, diethanolamine, triethanolamine, N-methylethanolamine, N,N-dimethylethanolamine, N-ethylethanolamine, N,N-diethylethanolamine, propanolamine, N,N-dimethylpropanolamine, N-ethylpropanolamine, N,N-diethylpropanolamine, 2-(2-aminoethoxy)ethanol, N-hydroxyethylpiperazine, 4-(2-hydroxyethyl)morpholine, 2-(2-hydroxyethyl)pyridine, 2-piperidine methanol and N-methyl-4-piperidinol.

3. The photoresist stripping composition according to claim 1, wherein said alkylene glycol monoalkyl ether is at least one compound selected from the group consisting of ethylene glycol monoethyl ether, ethylene glycol monobutyl ether, propylene glycol monomethyl ether, propylene glycol monoethyl ether, propylene glycol monobutyl ether, diethylene glycol monomethyl ether, diethylene glycol monoethyl ether, diethylene glycol monopropyl ether, diethylene glycol monobutyl ether, dipropylene glycol monomethyl ether, dipropylene glycol monoethyl ether, dipropylene glycol monopropyl ether, dipropylene glycol monobutyl ether, triethylene glycol monomethyl ether, triethylene glycol monoethyl ether, triethylene glycol monopropyl ether, triethylene glycol monobutyl ether, tripropylene glycol monomethyl ether, tripropylene glycol monoethyl ether, tripropylene glycol monopropyl ether and tripropylene glycol monobutyl ether.

4. The photoresist stripping composition according to claim 1, wherein said sugar is monosaccharide or polysaccharide.

5. The photoresist stripping composition according to claim 1, wherein said monosaccharide has 3 to 6 carbon atoms.

6. The photoresist stripping composition according to claim 4, wherein said monosaccharide is at least one compound selected from the group consisting of glycerin aldehyde, threose, arabinose, xylose, ribose, ribulose, xylulose, glucose, mannose, galactose, tagatose, allose, altrose, gulose, idose, talose, sorbose, psicose and fructose.

7. The photoresist stripping composition according to claim 4, wherein said polysaccharide is at least one compound selected from the group consisting of sucrose, maltose, cellobiose, lactose, sophorose, laminaribiose, manninotriose, araban, xylan, mannan and starch.

8. The photoresist stripping composition according to claim 1, wherein said sugar alcohol is at least one compound selected from the group consisting of threitol, erythritol, adonitol, arabitol, xylitol, talitol, sorbitol, mannitol, iditol and dulcitol.

9. The photoresist stripping composition according to claim 1, wherein said phosphonic acid chelating agent is at least one compound selected from the group consisting of phosphonic acids, N-oxides thereof, ammonium salts thereof, alkali metal salts thereof and organic amine salts thereof.

10. The photoresist stripping composition according to claim 9, wherein said phosphonic acid is at least one compound selected from the group consisting of methyldiphosphonic acid, hydroxyethanediphosphonic acid, aminotris(methylene)phosphonic acid, ethylidenediphosphonic acid, 1-hydroxyethylidene-1,1-diphosphonic acid, 1-hydroxypropylidene-1,1-diphosphonic acid, ethylaminobis(methylene)phosphonic acid, dodecylaminobis(methylene)phosphonic acid, nitrilotris(methylene)phosphonic acid, ethylenediaminebis(methylene)phosphonic acid, ethylenediaminetetrakis(methylene)phosphonic acid, hexenediaminetetrakis(methylene)phosphonic acid, and diethylenetriaminepentamethylenephosphonic acid.

11. The photoresist stripping composition according to claim 1, comprising (1) 30 to 80% by weight of said nitrogen-containing organohydroxyl compound, (2) 5 to 40% by weight of said alkylene glycol monoalkyl ether, (3) 0.1 to 15% by weight of said sugar or sugar alcohol, (4) 0.01 to 10% by weight of said phosphorus-containing compound and (5) balance being water.

12. A process for stripping photoresist comprising applying said photoresist stripping agent composition according to claim 1 to a photoresist.

13. The process according to claim 12, wherein said photoresist is photoresist film formed on an inorganic substrate.

14. The process according to claim 12, comprising:
forming a photoresist film on an inorganic substrate;
patterning said photoresist film to form a mask on said inorganic substrate;
etching a non-masked region of a film underlying said patterned photoresist film while using said patterned resist film as a mask; and
stripping said patterned photoresist film with said photoresist stripping composition.

15. The process according to claim 12, comprising:

forming a photoresist film on an inorganic substrate;

patterning said photoresist film to form a mask on said inorganic substrate;

etching a non-masked region of a film underlying said patterned photoresist film while using said patterned resist film as a mask;

ashing said patterned photoresist film; and removing photoresist residues remaining on said inorganic substrate by said photoresist stripping composition.

16. The photoresist stripping composition according to claim 11, comprising 40% to 60% by weight of said nitrogen-containing organohydroxyl compound, 15% to 30% by weight of said alkylene glycol monoalkyl ether, 1% to 10% by weight of said sugar or sugar alcohol, 0.1% to 5% by weight of said phosphorus-containing compound and balance being water.

17. The photoresist stripping composition according to claim 1, wherein the nitrogen-containing organohydroxyl compound is monoethanolamine, the alkylene glycol monoalkyl ether is diethylene glycol monobutyl ether, the sugar or sugar alcohol is sorbitol, and the phosphorus-containing compound is hydroxyethanediphosphonic acid.

* * * * *